DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JULY 25, 1972

900 O.G. 1234

T900,030

LIGHT-SENSITIVE COMPOSITIONS AND PHOTOGRAPHIC ELEMENTS

David A. Thomas, 19 St. Thomas Drive, Hatch End, Pinner, Middlesex, England, and Colin Holstead, 59 Kindersley Way, Abbotts Langley, Hertfordshire, England

Filed July 6, 1971, Ser. No. 160,160

Claims priority, application Great Britain, Oct. 15, 1970, 49,106/70

Int. Cl. G03c *5/24*

U.S. Cl. 96—48

No Drawing. 23 Pages Specification

Light-sensitive compositions including a polymer of the type (e.g. polymers including acryloylpeptide units as described in Canadian Pat. 786,748 and polymers derived from a polyol and an unsaturated polycarboxylic acid as described in Canadian Pat. 837,083) that is reactable with a sensitizer when exposed to light in combination with a sensitizing amount of naphthalene sensitizer having ortho diazo and oxo substituents at the 1,2 or the 2,1 positions of the naphthalene nucleus and further having an alkoxysulfonyl group, the terminal carbon atom of which is trihalo (preferably chloro and bromo) substituted, and wherein the sulfonyl moiety is bonded directly to the naphthalene nucleus at the 4 or the 5-position, are advantageous in the preparation of positive-working photolithographic materials. Desirable such naphthalene sensitizers include such materials as 2-diazo-1,2-dehydro-1-oxo-5 [(2′,2′,2′-tribromoethoxy) sulfonyl] naphthalene and 2-diazo-1,2-dehydro-1-oxo-5 [(2′,2′,2′-trichloroethoxy) sulfonyl] naphthalene. The light-sensitive compositions can be coated on support materials to prepare composite photographic elements which can be processed by contact with aqueous alkaline solutions. The processed elements have utility as photolithographic printing masters and photoresists for etching operations.